United States Patent
Pentlehner et al.

(10) Patent No.: US 12,302,689 B2
(45) Date of Patent: May 13, 2025

(54) ORGANIC LIGHT-EMITTING COMPONENT HAVING A LIGHT-EMITTING LAYER AS PART OF A CHARGE GENERATION LAYER

(71) Applicant: Pictiva Displays International Limited, Dublin (IE)

(72) Inventors: Dominik Pentlehner, Burghausen (DE); Andreas Rausch, Regensburg (DE); Arndt Jaeger, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 0 days.

(21) Appl. No.: 18/504,567

(22) Filed: Nov. 8, 2023

(65) Prior Publication Data
US 2024/0081091 A1    Mar. 7, 2024

Related U.S. Application Data

(60) Continuation of application No. 17/531,249, filed on Nov. 19, 2021, now Pat. No. 11,849,598, which is a
(Continued)

(30) Foreign Application Priority Data

Feb. 19, 2015    (DE) .............................. 102015102371

(51) Int. Cl.
*H10K 50/19*    (2023.01)
*C09K 11/06*    (2006.01)
(Continued)

(52) U.S. Cl.
CPC .............. *H10K 50/19* (2023.02); *C09K 11/06* (2013.01); *H10K 50/12* (2023.02); *H10K 50/18* (2023.02);
(Continued)

(58) Field of Classification Search
CPC ........ H10K 50/12; H10K 50/15; H10K 50/16; H10K 50/18; H10K 50/19; H10K 85/342; C09K 11/06
(Continued)

(56) References Cited

U.S. PATENT DOCUMENTS

| | | |
|---|---|---|
| 7,345,300 B2 | 3/2008 | Qin et al. |
| 10,593,910 B2 * | 3/2020 | Pentlehner ............. H10K 50/12 |

(Continued)

FOREIGN PATENT DOCUMENTS

| | | |
|---|---|---|
| DE | 10224021 B4 | 6/2006 |
| EP | 2713416 A1 | 4/2014 |

(Continued)

OTHER PUBLICATIONS

Kim, Jong H. et al.: "Phosphorescent dye-doped hole transporting layer for organic light-emitting diodes", Organic Electronics 15 (2014) 2381-2386.
(Continued)

*Primary Examiner* — Hoai V Pham
(74) *Attorney, Agent, or Firm* — Botos Churchill IP Law LLP

(57) ABSTRACT

An organic light-emitting component is disclosed. The component includes an organic functional layer stack between two electrodes, where the organic functional layer stack has at least two organic light-emitting layers and at least one charge generation layer, and where at least one of the at least two organic light-emitting layers is part of the charge generation layer.

9 Claims, 2 Drawing Sheets

Related U.S. Application Data continuation of application No. 16/792,517, filed on Feb. 17, 2020, now Pat. No. 11,211,590, which is a division of application No. 15/549,606, filed as application No. PCT/EP2016/052896 on Feb. 11, 2016, now Pat. No. 10,593,910.

(51) Int. Cl.
  *H10K 50/12* (2023.01)
  *H10K 50/18* (2023.01)
  *H10K 50/15* (2023.01)
  *H10K 50/16* (2023.01)
  *H10K 85/30* (2023.01)

(52) U.S. Cl.
  CPC .............. *C09K 2211/1029* (2013.01); *C09K 2211/185* (2013.01); *H10K 50/15* (2023.02); *H10K 50/16* (2023.02); *H10K 85/342* (2023.02)

(58) Field of Classification Search
  USPC .......................................................... 257/40
  See application file for complete search history.

(56) References Cited

U.S. PATENT DOCUMENTS

| | | |
|---|---|---|
| 11,211,590 B2 | 12/2021 | Pentlehner et al. |
| 2006/0231843 A1 | 10/2006 | Qin et al. |
| 2012/0091923 A1 | 4/2012 | Kastner-Jung et al. |
| 2013/0285035 A1 | 10/2013 | Taka et al. |
| 2017/0207411 A1 | 7/2017 | Hoefling et al. |

FOREIGN PATENT DOCUMENTS

| | | |
|---|---|---|
| WO | 03100880 A2 | 12/2003 |
| WO | 2010066245 A1 | 6/2010 |
| WO | 2011097259 A1 | 8/2011 |

OTHER PUBLICATIONS

Examination Report with Search Report from corresponding German Patent Application No. 10 2015 017 493.2 dated Dec. 9, 2024 (24 pp.).

\* cited by examiner

ORGANIC LIGHT-EMITTING COMPONENT HAVING A LIGHT-EMITTING LAYER AS PART OF A CHARGE GENERATION LAYER

CROSS-REFERENCE TO RELATED APPLICATIONS

The present application is a continuation of U.S. patent application Ser. No. 17/531,249, filed Nov. 19, 2021, now U.S. Pat. No. 11,849,598, which is a continuation of U.S. patent application Ser. No. 16/792,517, filed Feb. 17, 2020, now U.S. Pat. No. 11,211,590, which is a divisional application of U.S. patent application Ser. No. 15/549,606, filed Aug. 8, 2017, now U.S. Pat. No. 10,593,910, which is a national phase entry under 35 U.S.C. § 371 of International Application No. PCT/EP2016/052896, filed Feb. 11, 2016, published as International Publication No. WO 2016/131699 A1, which claims priority to German Patent Application No. 102015102371.7, filed Feb. 19, 2015, the disclosures of which are hereby incorporated herein by reference.

TECHNICAL FIELD

An organic light-emitting component is provided.

BACKGROUND

An organic light-emitting diode (OLED) can convert pairs of charge carriers injected into an organic emitter layer to photons, each pair being formed from an electron and a hole. In an OLED with only one emitter layer, a maximum of one photon can be generated per pair of charge carriers injected. In order to achieve higher efficiency, it is known to stack multiple emitter layers one on top of another, wherein a charge generation layer (CGL) is arranged between adjacent emitter layers in each case. As a result, it may be possible to generate multiple photons per pair of charge carriers injected into such a stack, since the charge generation layers act as internal anodes and cathodes.

A CGL generally has a p-doped region and an n-doped region, which are connected together via an intermediate layer. A disadvantage of such a construction, in which the CGLs represent additional layers to those necessary for light emission, can lie in the fact that the CGL layers employed often absorb in the wavelength range in which the OLED emits, resulting in a decrease in the efficiency of the OLED. Conventional commercially available p- and n-dopants are, moreover, often expensive compared with other materials of an OLED. Furthermore, a conductivity doping can generally bring about a strong temperature-dependence of the operating voltage and it is therefore assumed that this also constitutes one of the limiting factors for the stability of OLEDs at high temperatures.

SUMMARY OF THE INVENTION

Embodiments of the invention provide an organic light-emitting component having at least two organic light-emitting layers.

According to at least one embodiment, an organic light-emitting component comprises at least two electrodes, between which an organic functional layer stack is arranged. The organic functional layer stack comprises the at least two organic light-emitting layers in the form of organic electroluminescent layers, which generate light by charge carrier recombination during operation of the organic light-emitting component. The organic light-emitting component can in particular be in the form of an organic light-emitting diode (OLED) having at least two organic light-emitting layers.

The organic functional layer stack can comprise layers with organic polymers, organic oligomers, organic monomers, organic small, non-polymeric molecules ("small molecules") or combinations thereof. The organic functional layer stack can comprise, in addition to the at least two organic light-emitting layers, at least one functional layer, which is configured as a hole-transport layer to allow effective hole injection into at least one of the light-emitting layers. As materials for a hole-transport layer, e.g., tertiary amines, carbazole derivatives, camphor sulfonic acid-doped polyaniline or polystyrene sulfonic acid-doped polyethylene dioxythiophene may prove advantageous. The organic functional layer stack can furthermore comprise at least one functional layer which is in the form of an electron-transport layer. In general, in addition to the at least two organic light-emitting layers, the organic functional layer stack can comprise a plurality of organic functional layers which are selected from hole-injection layers, hole-transport layers, electron-injection layers, electron-transport layers, hole-blocking layers and electron-blocking layers. In particular, the layers of the organic functional layer stack can be completely or at least predominantly organic functional layers. In addition, it may also be possible that individual layers of the organic functional layer stack also comprise or are formed from inorganic materials, such as, e.g., an intermediate layer of a charge generation layer, as described below.

With regard to the construction of an organic light-emitting component in principle, and in particular here with regard to the construction, layer composition and materials of the organic functional layer stack, reference is made to the document WO 2010/066245 A1, which is hereby explicitly incorporated by reference.

According to a further embodiment, the organic functional layer stack with the two electrodes is arranged on a substrate. The substrate can comprise, e.g., one or more materials in the form of a layer, a sheet, a film or a laminate, which are selected from glass, quartz, plastic, metal, silicon wafer. Particularly preferably, the substrate comprises glass, e.g., in the form of a glass layer, glass film or glass sheet, or is composed thereof.

According to a further embodiment, at least one of the electrodes is transparent in form. The term "transparent" here and below refers to a layer that transmits visible light. In this case, the transparent layer can be clearly translucent or at least partially light scattering and/or partially light absorbing, so that the transparent layer can also be, e.g., diffusely or milkily translucent. Particularly preferably, a layer referred to here as transparent transmits as much light as possible, so that in particular the absorption of light generated in the organic functional layer stack during operation of the component is as low as possible.

The two electrodes between which the organic functional layer stack is arranged can also both be transparent in form, for example, so that the light generated in the at least two light-emitting layers between the two electrodes can be emitted in both directions, i.e., through both electrodes. In the event that the organic light-emitting component comprises a substrate, this means that light can be emitted both through the substrate, which is then also transparent in form, and in the direction facing away from the substrate. Furthermore in this case, all the layers of the organic light-emitting component can be transparent in form, so that the organic light-emitting component forms a transparent OLED. In addition, it may also be possible that one of the two electrodes between which the organic functional layer stack is arranged is non-transparent and preferably reflective in form, so that the light generated in the at least two light-emitting layers between the two electrodes can be emitted in only one direction through the transparent electrode. If the electrode arranged on the substrate is transparent and the substrate is also transparent in form, this is also known as a so-called "bottom emitter", while in the event that the electrode arranged facing away from the substrate is transparent in form, this is known as a so-called "top emitter".

The organic functional layer stack of the organic light-emitting component described here furthermore comprises at least one charge generation layer. A "charge generation layer" here and below describes a layer sequence which is generally formed by a p-n junction. The charge generation layer, which can also be referred to as a CGL, is in particular in the form of a tunnel junction-forming p-n junction, which is operated in a reverse direction and which can be employed for effective charge separation and thus for the "generation" of charge carriers.

According to a further embodiment, the charge generation layer comprises a first organic layer, which is doped with a first charge carrier type. Furthermore, the charge generation layer comprises a second organic layer, which is doped with a second charge carrier type, which differs from the first charge carrier type. In particular, the charge generation layer comprises an electron-conducting layer and a hole-conducting layer. "Electron-conducting" and "hole-conducting" can also be referred to here and below as n-conducting and p-conducting respectively. In other words, the charge generation layer comprises at least two organic layers, one of which is p-doped and the other n-doped.

Furthermore, at least one of the at least two organic light-emitting layers is part of the charge generation layer. This means in other words that at least one layer of the charge generation layer simultaneously also forms one of the at least two organic light-emitting layers and contains a material that emits light during operation of the organic light-emitting component. In particular, at least the first or second organic layer of the charge generation layer can thus simultaneously be one of the at least two organic light-emitting layers. This also means in other words that at least one of the two organic light-emitting layers of the functional layer stack has the functionality of an organic layer of the charge generation layer, which is therefore p- or n-conducting and contributes to the generation of charge carriers in the charge generation layer. At least part of the charge generation layer thus forms a light-generating region, i.e., at least one of the organic light-emitting layers of the organic light-emitting component.

The organic light-emitting component described here is based in particular on the consideration of substantially simplifying the construction of a stacked OLED, i.e., an OLED with at least two organic light-emitting layers, through the fact that at least one light-emitting layer or both light-emitting layers take(s) on the function of a p- and/or n-layer in a charge generation layer. This can be achieved by using at least one light-emitting layer, which additionally has p- or n-conducting properties and which, together with at least one further layer of opposite conductivity, displays a CGL effect. By means of the construction of the organic light-emitting component described here, it may be possible to dispense with commercial p- and n-dopants doped into conventional hole- and electron-conducting matrix materials and to achieve a simpler OLED construction.

According to a further embodiment, in the organic light-emitting layer which is formed as part of the charge generation layer, an emitter material is used which acts simultaneously as a p- or n-dopant. This can mean, e.g., that the at least one of the at least two organic light-emitting layers that is part of the charge generation layer comprises a material that acts simultaneously as a dopant and an emitter material. Alternatively, it may also be possible that an organic light-emitting layer that is part of the charge generation layer comprises an emitter material and additionally a dopant.

For example, the at least one of the at least two organic light-emitting layers that is part of the charge generation layer can comprise a p-dopant which is simultaneously an emitter material. The p-dopant which is simultaneously an emitter material can comprise or be composed of, e.g., Ir(ppy)3 (tris-(2-phenylpyridine)¬iridium(III)).

Furthermore, the at least one of the at least two organic light-emitting layers that is part of the charge generation layer can comprise an n-dopant which is simultaneously an emitter material.

According to a further embodiment, precisely one of the at least two organic light-emitting layers is part of the charge generation layer. Furthermore, between the other of the at least two organic light-emitting layers, i.e., the organic light-emitting layer that is not part of the charge generation layer, and the charge generation layer, a charge carrier blocking layer can be arranged.

According to a further embodiment, the at least two organic light-emitting layers are both parts of the charge generation layer. In this case, the at least two organic light-emitting layers form the first and second organic layers of the charge generation layer and are doped with different charge carrier types.

A hole-conducting organic layer, in particular a hole-conducting layer of the charge generation layer, which can be an organic light-emitting layer or a pure CGL layer without light emission, can be in the form of a p-doped layer, which comprises an inorganic or organic dopant in an organic hole-conducting matrix. Suitable as inorganic dopants are, e.g., transition metal oxides, such as vanadium oxide, molybdenum oxide or tungsten oxide. Suitable as organic dopants are, e.g., tetrafluorotetracyanoquino-idimethane (F4-TCNQ) or copper pentafluorobenzoate (Cu(I) pFBz). Furthermore, e.g., transition metal complexes are suitable as organic dopants. These can preferably comprise a central atom, e.g., Cu, with ligands, e.g., acetylacetonate (acac). Furthermore, e.g., copper complexes, e.g., copper carboxylates, or metal complexes with bismuth and/or chromium are suitable.

An electron-conducting organic layer, in particular an electron-conducting layer of the charge generation layer, which can be an organic light-emitting layer or a pure CGL layer, can be in the form of an n-doped layer, which comprises an n-dopant, e.g., a metal with a low work function such as, e.g., Cs, Li, Ca, Na, Ba or Mg or compounds thereof, e.g., CS2CO3 or CS3PO4, in an organic electron-conducting matrix.

Suitable matrix materials for a hole-conducting layer can be one or more materials selected from a group comprising HAT-CN (hexaazatriphenylenehexacarbonitrile), F16CuPc (copper hexadecafluorophthalocyanine), α-NPD, NPB (N,N'-bis(naphthalen-1-yl)-N,N'-bis(phenyl)benzidine), beta-NPB (N,N'-bis(naphthalen-2-yl)-N,N'-bis(phenyl)benzidine), TPD (N,N'-bis(3-methylphenyl)-N,N'-bis(phenyl) benzidine), spiro-TPD (N,N'-bis(3-methylphenyl)-N,N'-bis (phenyl)benzidine), spiro-NPB (N,N'-bis(naphthalen-1-yl)-

N,N'-bis(phenyl)spiro), DMFL-TPD (N,N'-bis(3-methylphenyl)-N,N'-bis(phenyl)-9,9-dimethylfluorene), DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalen-1-yl)-N,N'-bis(phenyl)-9,9-diphenylfluorene), spiro-TAD (2,2',7,7'-tetrakis(N,N-diphenyl¬amino)-9,9'-spirobifluorene), 9,9-bis[4-(N,N-bis-biphenyl-4-yl-amino)phenyl]-9H-fluorene, 9,9-bis[4-(N,N-bis¬naphthalen-2-yl-amino)phenyl]-9H-fluorene, 9,9-bis[4-(N,N'-bisnaphthalen-2-yl-N,N'-bisphenylamino)phenyl]-9H-fluorine, N,N'-bis(phenanthren-9-yl)-N,N'-bis(phenyl)-ibenzidine, 2,7-bis[N,N-bis(9,9-spirobifluoren-2-yl)amino]-9,9-spirobifluorene, 2,2'-bis[N,N-bis(biphenyl-4-yl)amino]-9,9-spirobifluorene, 2,2'-bis(N,N-diphenyl¬amino)-9,9-spirobifluorene, di-[4-(N,N-ditolyl-amino)-phenyl]cyclohexane, 2,2',7,7'-tetra(N,N-ditolyl)¬amino¬spirobifluorene, N,N,N',N'-tetranaphthalen-2-yl-benzidine and mixtures of these compounds.

Suitable matrix materials for an electron-conducting layer can be one or more materials selected from a group comprising 2,2',2"-(1,3,5-benzinetriyl)-tris(1-phenyl-1-H-benzimidazole), 2-(4-biphenylyl)-5-(4-tert-butylphenyl)-1,3,4-oxadiazole, 2,9-dimethyl-4,7-diphenyl-1,10-phenanthroline (BCP), 8-hydroxyquinolinolato-lithium, 4-(naphthalen-1-yl)-3,5-diphenyl-4H-1,2,4-triazole, 1,3-bis[2-(2,2'-bipyridin-6-yl)-1,3,4-oxadiazo-5-yl]benzene, 4,7-diphenyl-1,10-phenanthroline (Bphen), 3-(4-biphenylyl)-4-phenyl-5-tert-butylphenyl-1,2,4-triazole, bis(2-methyl-8-quinolinolate)-4-(phenyl¬phenolato)-aluminum, 6,6'-bis[5-(biphenyl-4-yl)-1,3,4-oxadiazo-2-yl]-2,2'-bipyridyl, 2-phenyl-9,10-di(naphthalen-2-yl)anthracene, 2,7-bis[2-(2,2'-bipyridin-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalen-2-yl)-4,7-diphenyl-1,10-phenanthroline, 2,9-bis(naphthalen-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f]¬[1,10]-phenanthroline, phenyldipyrenylphosphine oxide, naphthalenetetracarboxylic dianhydride and imides thereof, perylentetracarboxylic dianhydride and imides thereof, materials based on siloles with a silacyclopentadiene unit and mixtures of the aforementioned substances.

According to a further embodiment, the first and second organic layers of the charge generation layer, at least one of which is an organic light-emitting layer, border one another directly. Alternatively, the charge generation layer can comprise an undoped intermediate layer between the first and second organic layers, i.e., between the electron-conducting layer and the hole-conducting layer. The intermediate layer can be formed, e.g., by a metal oxide, such as VOx, e.g., V2O5, MoOx, WOx, Al2O3, indium tin oxide, SnOx and/or ZnOx, or an organometallic compound such as a phthalocyanine, e.g., copper phthalocyanine (CuPc), vanadyl phthalocyanine (VOPc), titanyl phthalocyanine (TiOPc), and furthermore can have a thickness of greater than or equal to 1 nm or greater than or equal to 2 nm and less than or equal to 10 nm or less than or equal to 5 nm. Furthermore, the intermediate layer can comprise or consist of a thin metal layer, e.g., with a thickness of greater than or equal to 0.1 nm and less than or equal to 5 nm and, e.g., with one or more metals selected from Al, Ag, Cu, Ca and Au. Furthermore, the intermediate layer can also comprise two or more of the aforementioned materials, e.g., in the form of a mixed layer. By means of the intermediate layer, e.g., a reaction of the, in some cases, highly reactive layers and/or a diffusion of dopants between the layers of the charge generation layer can be suppressed.

In the organic light-emitting component described here, a simplified stack construction compared with conventional OLEDs with CGLs is advantageously possible, since at least one organic light-emitting layer also takes on the additional function of a layer of a CGL. Associated with this, a more rapid and simplified production may also be possible with a lower cycle time, which can be advantageous in particular for inline manufacturing. Furthermore, it may be possible that the organic light-emitting component offers higher stability owing to a reduced number of loss channels, materials and interfaces. In addition, higher efficiency may be possible in relation to light emission owing to a reduction in the absorption loss of the emitted light in the doped layers and in relation to a lower voltage drop as a result of a smaller number of layers. By means of at least partially avoiding the use of expensive commercial p- and n-dopants, lower costs can also be obtained.

BRIEF DESCRIPTION OF THE DRAWINGS

Further advantages, advantageous embodiments and developments can be taken from the exemplary embodiments described below in conjunction with the figures.

These show the following.

In the exemplary embodiments and figures, identical or similar elements or elements having the same effect can be provided with the same reference numbers. The elements illustrated and the size ratios to one another thereof should not be considered as being to scale; rather, to illustrate them better and/or to make them easier to understand, the size of individual elements, such as, e.g., layers, parts, components and regions, may be exaggerated.

DETAILED DESCRIPTION OF ILLUSTRATIVE EMBODIMENTS

Figure 1:
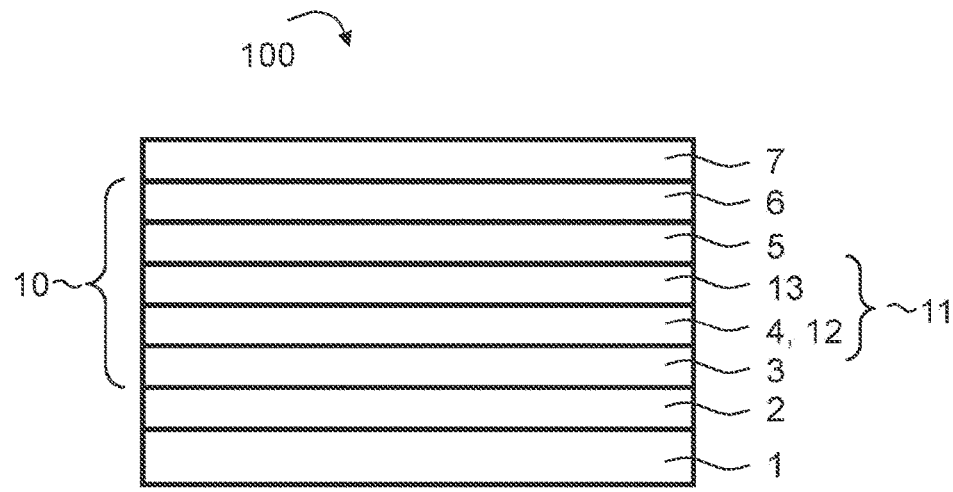
FIG. 1 is a schematic diagram of an organic light-emitting component according to an exemplary embodiment.

FIG. 1 shows an exemplary embodiment of an organic light-emitting component 100, which comprises an organic functional layer stack 10 having at least two organic light-emitting layers 4, 5 between two electrodes 2, 7.

In the exemplary embodiment shown, the electrodes 2, 7 and the organic functional layer stack 10 are arranged on a substrate 1. The substrate 1 can act as a carrier element for the layers applied thereon and comprise or be formed from, e.g., glass, for instance in the form of a glass film or glass sheet, quartz and/or a semiconductor material. Alternatively, the substrate 1 can also comprise or be formed from a plastic film or a laminate of multiple plastic films and/or glass films.

At least one of the two electrodes 2, 7 is transparent in form, wherein at least in the event that the organic light-emitting component 100 is in the form of a bottom emitter, in which the lower electrode 2 arranged between the substrate 1 and the organic functional layer stack 10 is transparent, the substrate 1 is also transparent in form. In the event that the organic light-emitting component 100 is in the form of a top emitter, at least the upper electrode 7 is transparent in form. If the organic light-emitting component 100 is intended to emit light only in one direction, the electrode arranged opposite to the emission direction, i.e., in the case of a bottom emitter the upper electrode 7 and in the case of a top emitter the lower electrode 2, is preferably reflective in form. If both electrodes 2, 7 and the substrate 1 are transparent, the organic light-emitting component is preferably in the form of a transparent OLED, which can emit light on both sides during operation.

As a material for a transparent electrode, e.g., a transparent conductive oxide can be used. Transparent conductive oxides (TCOs) are transparent, conductive materials, generally metal oxides such as, e.g., zinc oxide, tin oxide, cadmium oxide, titanium oxide, indium oxide, indium tin oxide (ITO) or aluminum zinc oxide (AZO). Besides binary metal-oxygen compounds, such as, e.g., ZnO, $SnO_2$ or $In_2O_3$, ternary metal-oxygen compounds, such as, e.g., $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of the TCOs. Furthermore, the TCOs do not necessarily correspond to a stoichiometric composition and can also be p- or n-doped.

Furthermore, a transparent electrode can also comprise a metal layer with a metal or alloy, e.g., with one or more of the following materials: Ag, Pt, Au, Mg, Ag:Mg. In addition, other metals are also possible. The metal layer in this case has such a low thickness that it at least partially transmits the light generated by the at least two organic light-emitting layers 4, 5 during operation of the organic light-emitting component 100, e.g., a thickness of less than or equal to 50 nm.

As a material for a reflective electrode, for example, a metal can be used which can be selected from aluminum, barium, indium, silver, gold, magnesium, calcium and lithium as well as compounds, combinations and alloys thereof. In particular, a reflective electrode can comprise Ag, Al or alloys with these, e.g., Ag:Mg, Ag:Ca, Mg:Al.

The electrodes 2, 7 can also comprise combinations of at least one or more TCO layers and at least one or more metal layers.

The electrodes 2, 7 can each be formed with a large surface area. This allows emission over a large surface area of the light generated in the organic light-emitting layers. "Large surface area" here can mean that the organic light-emitting component 100 has an area of greater than or equal to several square millimeters, preferably greater than or equal to one square centimeter and particularly preferably greater than or equal to one square decimeter.

The organic light-emitting component 100 is in the form of a so-called stacked OLED, in which the at least two organic light-emitting layers 4, 5 are arranged one on top of another in the stack direction within the organic functional layer stack 10. The organic functional layer stack 10 furthermore comprises a charge generation layer 11, wherein in the exemplary embodiment shown, the organic light-emitting layer 4 is part of the charge generation layer 11. In particular, the charge generation layer 11 in the exemplary embodiment shown comprises a first organic layer 12, which is doped with a first charge carrier type, and a second organic layer 13, which is doped with a second charge carrier type, which is different from the first charge carrier type. The first organic layer 12, which is simultaneously the organic light-emitting layer 4, and the second organic layer 13 border one another directly in the exemplary embodiment shown and form a reverse biased p-n junction, which leads to a separation of charge carriers and thus to a provision of charge carriers for the organic light-emitting layers 4 and 5 during operation of the organic light-emitting component 100.

For example, the lower electrode 2 can be in the form of an anode and the upper electrode 7 in the form of a cathode. In this case, the first organic layer 12 or organic light-emitting layer 4 is in an electron-conducting form and the second organic layer 13 in a hole-conducting form. Accordingly, the first organic layer 12 or organic light-emitting layer 4 is in an n-doped form and the second organic layer 13 in a p-doped form.

Alternatively to the described polarity of the electrodes 2, 7 and the corresponding form of the layers of the organic functional layer stack 10, the polarity of the organic light-emitting component 100 can also be reversed, so that the lower electrode 2 can be in the form of a cathode and the upper electrode 7 in the form of an anode. In this case, the dopings of the organic layers 12, 13 of the charge generation layer 11 are also reversed. The first organic layer 12 or organic light-emitting layer 4 is therefore p-doped in this case, while the second organic layer 13 is n-doped.

The p- or n-conducting properties of the organic light-emitting layer 4 can be achieved by the fact that said layer comprises a matrix material in which an emitter material is contained, which at the same time acts as a p- or n-dopant respectively. In the event that the organic light-emitting layer 4 simultaneously forms a p-doped first organic layer 12 of the charge generation layer 11, e.g., Ir(ppy)3 can be used as a material that forms an emitter and, at the same time, a p-dopant. Alternatively, it may also be possible that a matrix material is used in which an emitter material for generating light and additionally a suitable dopant are contained.

Alternatively to the exemplary embodiment shown, it may also be possible that, instead of the organic light-emitting layer 4, the organic light-emitting layer 5 is formed as part of the charge generation layer 11. In this case, the organic light-emitting layer 5 forms, e.g., the second organic layer 13 of the charge generation layer 11, while the first organic layer 12 is arranged between the organic light-emitting layers 4, 5. The features of the organic light-emitting layers 4, 5 and charge generation layer 11 described above apply mutatis mutandis in this case.

Furthermore, it may also be possible that the organic functional layer stack 10 comprises more than two organic light-emitting layers, in which case a charge generation layer can be arranged between two directly adjacent organic light-emitting layers in each case. At least one or each of the charge generation layers can comprise at least one organic layer, which is formed by one of the organic light-emitting layers.

The organic functional layer stack 10 can, in addition to the organic functional layers 4, 5, 12, 13 described, comprise further organic functional layers. In the exemplary embodiment shown, purely by way of example, charge carrier injection and transport layers 3 and 6 respectively are shown, which are hole- or electron-conducting depending on the polarity of the electrodes 2, 7.

Furthermore, an encapsulating arrangement, preferably in the form of a thin layer encapsulation (not shown), can be applied over the electrodes 2, 7 and the organic functional layer stack 10 to protect the organic light-emitting component 100 and in particular the layers of the organic functional layer stack 10 and the electrodes 2, 7 from harmful materials from the environment, such as, e.g., moisture and/or oxygen and/or other corrosive substances such as hydrogen sulfide. To this end, the encapsulating arrangement can comprise one or more thin layers, which are applied, e.g., by means of an atomic layer deposition process and which comprise, e.g., one or more of the materials aluminum oxide, zinc oxide, zirconium oxide, titanium oxide, hafnium oxide, lanthanum oxide and tantalum oxide. The encapsulating arrangement can furthermore comprise a mechanical protection in the form of a plastic layer and/or a laminated glass layer, e.g., on a thin layer encapsulation, as a result of which, e.g., scratch protection can be achieved. Alternatively, other encapsulating arrangements are also possible, e.g., in the form of an adhesively bonded glass cover.

In conjunction with FIGS. 2 to 5, in sections of an organic light-emitting component, further exemplary embodiments are shown in relation to the form of the organic light-emitting layers 4, 5 and charge generation layer 11, which represent modifications of the exemplary embodiment of FIG. 1. The following description therefore relates primarily to differences compared with the exemplary embodiment of FIG. 1 or the exemplary embodiments described previously in each case.

Figure 2:
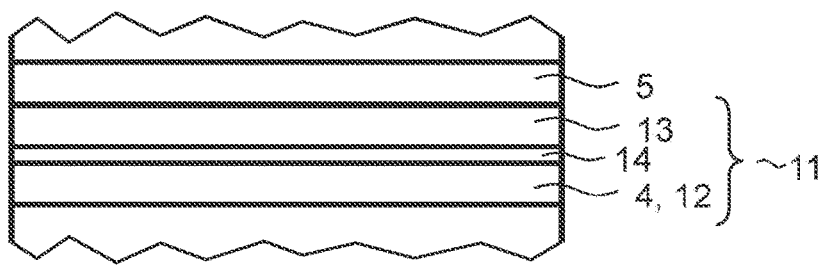
FIG. 2 is a schematic diagram of a section of an organic light-emitting component according to a further exemplary embodiment.

As shown in FIG. 2, the charge generation layer 11 can additionally comprise an intermediate layer 14 between the first organic layer 12 and the second organic layer 13, which separates the materials of the organic layers 12, 13. This may be advantageous in particular if a reaction between the materials of the layers 12 and 13 or a diffusion, e.g., of dopants, between these layers is to be prevented. The intermediate layer 14 can comprise materials as described above in the general part.

Figure 3:
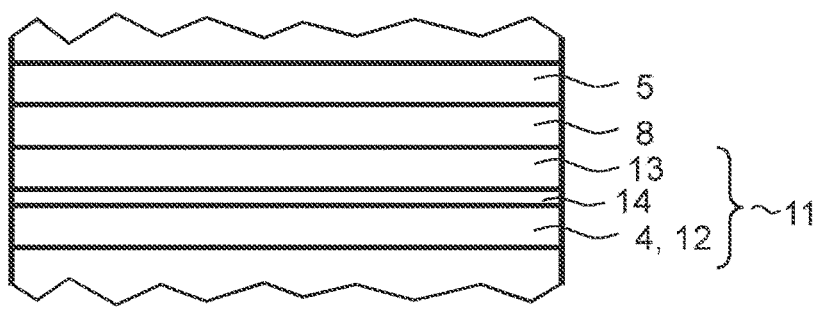
FIG. 3 is a schematic diagram of a section of an organic light-emitting component according to a further exemplary embodiment.

In FIG. 3, a further exemplary embodiment is shown in which a charge carrier blocking layer 8 is additionally arranged between the charge generation layer 11 and the organic light-emitting layer 5, which is not part of the charge generation layer 11. In the event that the second organic layer 13 is p-conducting, the charge carrier blocking layer 8 can be an electron blocking layer. In the event that the second organic layer 13 is n-conducting, the charge carrier blocking layer 8 can accordingly be a hole blocking layer. Alternatively to the exemplary embodiment shown, the organic layers 12, 13 of the charge generation layer 11 can also border one another directly without an intermediate layer 14 arranged between them.

As in the description of the exemplary embodiment of FIG. 1, the exemplary embodiments of FIGS. 2 and 3 also apply to both possible polarities of the organic light-emitting component 100. Furthermore, it is also possible that, instead of the organic light-emitting layer 4, the organic light-emitting layer 5 is part of the charge generation layer 11. The features described in conjunction with the intermediate layer 14 and the charge carrier blocking layer 8 apply mutatis mutandis in this case.

Figure 4:
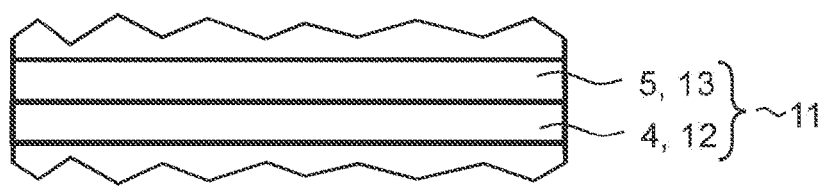
FIG. 4 is a schematic diagram of a section of an organic light-emitting component according to a further exemplary embodiment.

In FIG. 4, a further exemplary embodiment is shown in which both organic light-emitting layers 4, 5 are in the form of layers of the charge generation layer 11, i.e., a first organic layer 12 and a second organic layer 13, which border one another directly without an intermediate layer arranged between them. The features described above in conjunction with the organic light-emitting layer 4, which simultaneously takes the form of the first organic layer 12 of the charge generation layer 11, apply in the same way to the organic light-emitting layers 4 and 5 wherein, depending on the polarity of the organic light-emitting component, one of the organic light-emitting layers 4 and 5 is p-doped and the other is n-doped. As described above, the dopant can in each case simultaneously form the emitter material of the appropriate layer or a suitable emitter material can be contained in addition to a dopant.

Figure 5:
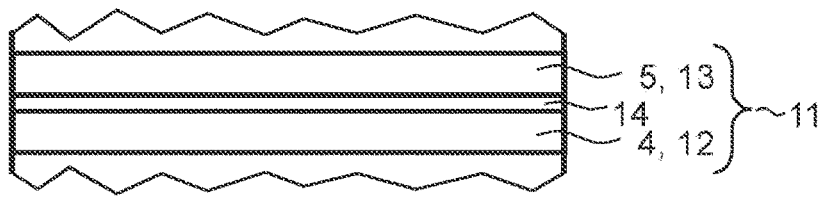
FIG. 5 is a schematic diagram of a section of an organic light-emitting component according to a further exemplary embodiment.

In FIG. 5, a further exemplary embodiment is shown which, in comparison with the exemplary embodiment of FIG. 4, additionally comprises an intermediate layer 14 between the organic light-emitting layers 4, 5 formed as parts of the charge generation layer 11, as described in conjunction with the exemplary embodiment of FIG. 2.

The exemplary embodiments and features thereof described in conjunction with the figures can also be combined with one another according to further exemplary embodiments, even if such combinations are not explicitly shown in the figures. Furthermore, the exemplary embodiments described in conjunction with the figures can comprise additional or alternative features according to the description in the general part.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. An organic light-emitting component comprising:
an organic functional layer stack between two electrodes, wherein one of the two electrodes is transparent;
wherein the organic functional layer stack comprises at least two organic light-emitting layers and at least one charge generation layer; and
wherein at least one of the at least two organic light-emitting layers is part of the charge generation layer; and
wherein the at least one of the at least two organic light-emitting layers that is part of the charge generation layer comprises an emitter material.

2. The organic light-emitting component of claim 1, wherein the other one of the two electrodes is non-transparent and reflective.

3. The organic light-emitting component of claim 1, wherein at least one of the electrodes comprises at least one of the following materials: Ag, Pt, Au, Mg, or Ag:Mg.

4. The organic light-emitting component of claim 1, wherein the charge generation layer comprises an electron-conducting layer.

5. The organic light-emitting component of claim 1, wherein the charge generation layer comprises a hole-conducting layer.

6. The organic light-emitting component of claim 1, wherein an undoped intermediate layer is arranged between an electron-conducting layer and a hole-conducting layer of the charge generation layer.

7. The organic light-emitting component of claim 6, wherein the intermediate layer comprises a metal or a metal oxide.

8. The organic light-emitting component of claim 1, wherein the emitter material simultaneously acts as a dopant.

9. The organic light-emitting component of claim 1, wherein the at least one of the at least two organic light-emitting layers that is part of the charge generation layer additionally comprises a dopant.

* * * * *